United States Patent
Lee et al.

(10) Patent No.: US 7,331,185 B2
(45) Date of Patent: Feb. 19, 2008

(54) HEAT RADIATOR HAVING A THERMO-ELECTRIC COOLER

(75) Inventors: Tsung-Chu Lee, Taipei (TW); Chung-Yang Chang, Taipei (TW); Ying-Hung Kan, Taipei (TW)

(73) Assignee: Macs Technology Inc., Lu-Chu Hsiang, Taoyuan Hsiang (TW)

( * ) Notice: Subject to any disclaimer, the term of this patent is extended or adjusted under 35 U.S.C. 154(b) by 118 days.

(21) Appl. No.: 11/397,390

(22) Filed: Apr. 5, 2006

(65) Prior Publication Data
US 2007/0234740 A1    Oct. 11, 2007

(51) Int. Cl.
F25B 21/02    (2006.01)

(52) U.S. Cl. ............................... 62/3.7; 62/259.2

(58) Field of Classification Search .................. 62/3.2, 62/3.3, 3.7, 259.2
See application file for complete search history.

(56) References Cited

U.S. PATENT DOCUMENTS 5,724,818 A * 3/1998 Iwata et al. ................... 62/3.7
6,502,405 B1 * 1/2003 Van Winkle .................. 62/3.61
6,625,990 B2 * 9/2003 Bell ............................... 62/3.3
6,639,797 B2 * 10/2003 Saeki et al. .................. 361/698

* cited by examiner

Primary Examiner—Melvin Jones

(57) ABSTRACT

A heat radiator having a thermo-electric cooler uses a plurality of heat radiation modules to induce forced thermal conduction at respective hot spots. The heat radiator comprises a first heat radiation module with a radiator fin set in which the fins are connected by a thermal conduction member attached onto a heat source. The thermo-electric cooler is attached to the heat source, whereby heat will be delivered from the heat absorption terminal to the heat release terminal thereof. The heat radiator further comprises a second heat radiation module with a radiator fin set in which the fins are connected by a thermal conduction member attached onto the thermo-electric cooler. Thereby, the heat generated in a heat source, such as a central processing unit (CPU) and an accelerated graphic chip, is dissipated through not only the first heat radiation module but also the thermo-electric cooler at the second heat radiation module.

10 Claims, 10 Drawing Sheets

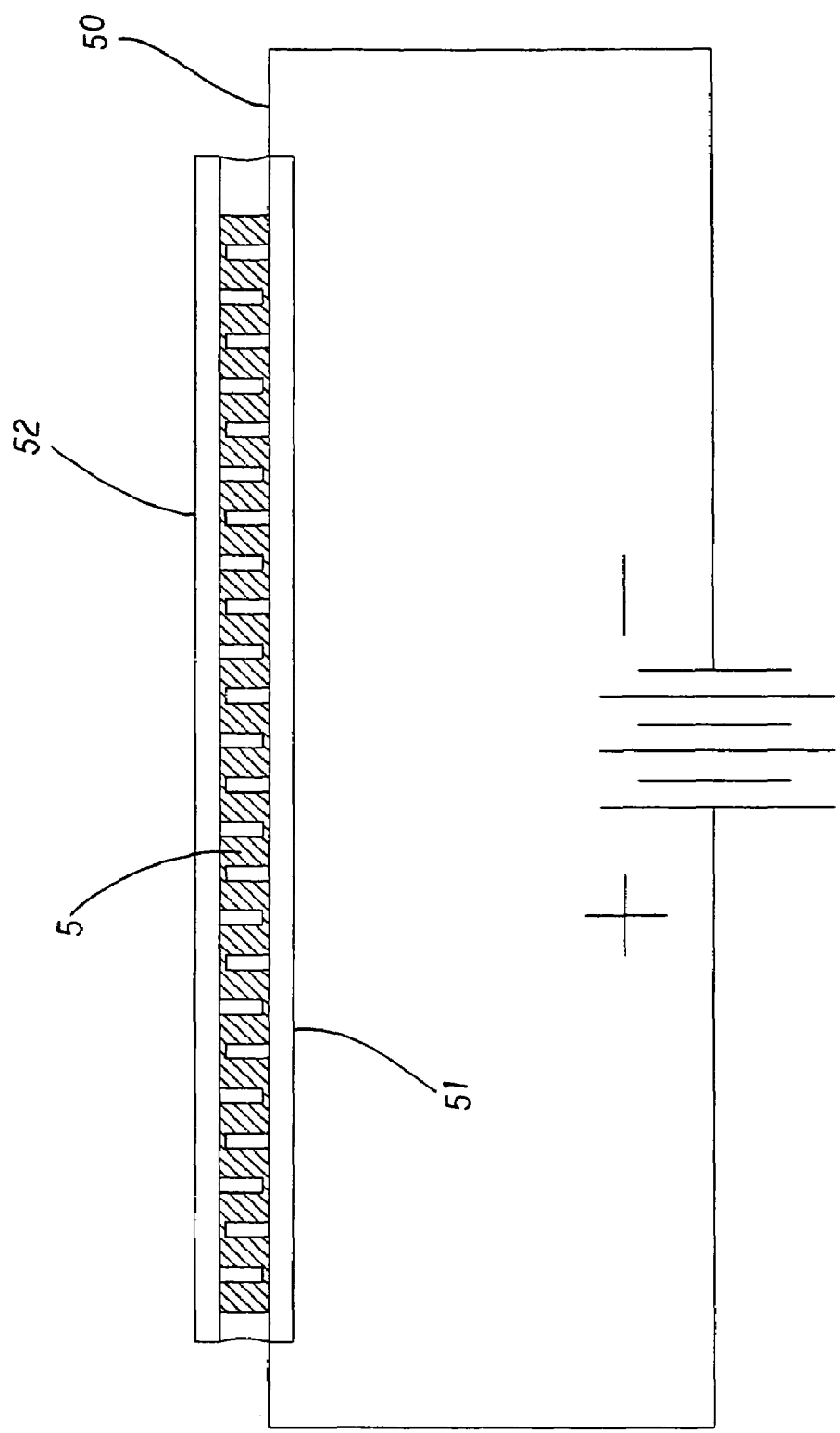

HEAT RADIATOR HAVING A THERMO-ELECTRIC COOLER

FIELD OF THE INVENTION

The present invention relates to heat radiators, and more particularly to a heat radiator having a thermo-electric cooler and a plurality of heat radiation modules for assisting heat dissipation of heat sources such as a central processing unit (CPU), an accelerated graphic chip and other electronic circuit elements.

BACKGROUND OF THE INVENTION

Given the faster and faster computer processors, technology of electronic heat dissipation has become a critical consideration in developing powerful computing. Heat transfer within a closed computer chassis utilizes thermal conduction, thermal convection and thermal radiation to guide the heat generated in a central processing unit (CPU), a graphics processing unit (GPU) or another chipset through heat sinks, heat pipes, radiator fins and fans out of the computer.

Thermo-electric coolers (TEC) are heat radiation components utilizing Peltier effect in a semiconductor, whereby heat can be delivered from a spatial point A to another spatial point B; namely, the heat at point A will be transported to point B so that the temperature at A will decrease and that at B will increase. Briefly speaking, heat is absorbed at A and released at B. A typical thermo-electric cooler is composed of a train of pairs of P type and N type semiconductor crystal granules; each of the semiconductor pairs has a metallic (copper or aluminum) conductor disposed between the P type and N type semiconductors to form a circuit loop. The bulk of semiconductor pairs is enclosed by two ceramic plates respectively on both sides of the cooler. When the cooler is charged, the N-type semiconductors will release heat, and the P-type semiconductors will absorb heat. Therefore, a cooler, made of train of N/P pairs, has a heat-absorbing terminal and a heat-releasing terminal, whereby the cooler will achieve heat dissipation by directional heat transport.

Thermo-electric coolers are often used in the heat dissipation of a central processing unit or any other heat-generating chips in a computer system. As shown in FIGS. 7 and 8, a thermo-electric cooler 5 has a heat-absorbing terminal 51 attached on a heat source 50 and a heat-releasing terminal 52 on a heat dissipation structure 90 including a heat sink and a fin set. Two interfaces of the terminals 51, 52 are applied with thermal grease for lowing the contact thermal resistance. Eventually, a fan 61 will blow wind onto the surfaces of the fins, so that forced convection within the heat dissipation structure 90 can be induced. In such an arrangement, the order of heat transportation is: heat source→thermo-electric cooler→heat sink/fins→system chassis→outer environment.

Practically, the necessary heat dissipation capacity a thermo-electric cooler needs to provide must much exceed the rated heat generating capacity of the cooler since it is electrically powered. The electric power of the cooler 5 is usually at least 30% of a central processing unit it is assigned to. According to the first law of thermodynamics, namely the conservation of energy, the rate of heat release of a cooler 5 is equal to the sum of the absorbing rate at the heat-absorbing terminal, the input electric power, and the rate of increase of internal energy. Therefore, a heat radiator equipped with a thermo-electric cooler will take away not only the heat generated by the CPU 50 (or another chipset) it is assigned to but also the electric power sent into the cooler 5. Briefly speaking, the role played by a thermo-electric cooler 5 in a heat radiator is not only a heat removing device 90 but also a significant heat source. Obviously, a heat radiator equipped with a thermo-electric cooler requires fins having a larger total surface area or a more powerful fan.

SUMMARY OF THE INVENTION

The primary objective of the present invention is to provide a heat radiator having a thermo-electric cooler capable of performing heat transfer from heat sources such as a central processing unit (CPU) and an accelerated graphic chip through not only a first heat radiation module but also a second heat radiation module applied at the heat release terminal of a thermo-electric cooler. Thereby, heat can be exhausted through two paths:

Heat conduction path 1: heat source first heat radiation module→computer system chassis, thermo-electric cooler, the second heat radiation module, exterior surrounding;

Heat conduction path 2: thermo-electric cooler, first heat radiation module→the second heat radiation module→computer system chassis→exterior surrounding.

The secondary objective of the present invention is to provide an appropriate heat transfer structure capable of supporting an efficient means of heat transfer, whereby the operation of a heat generating circuit element, such as a CPU, will be secured.

The various objects and advantages of the present invention will be more readily understood from the following detailed description when read in conjunction with the appended drawings.

BRIEF DESCRIPTION OF THE DRAWINGS

FIG. 1A is a perspective view of the first set of preferred embodiments in FIG. 1.

FIG. 3A is a local side view of a thermoelectric cooler.

DETAILED DESCRIPTION OF THE PREFERRED EMBODIMENTS

Figure 1:
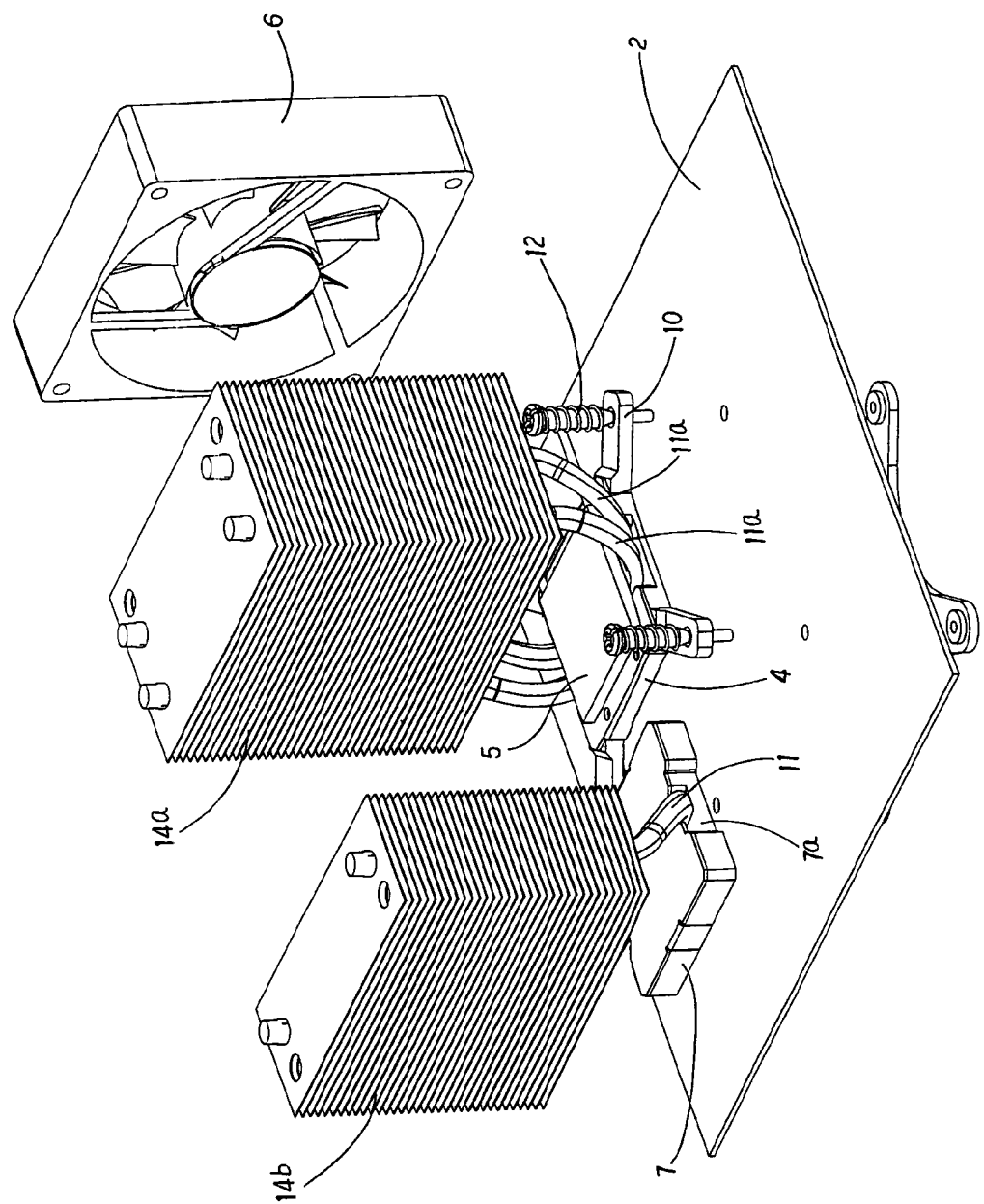
FIG. 1 is an exploded perspective view of the first preferred embodiment of the present invention.
Figure 1:
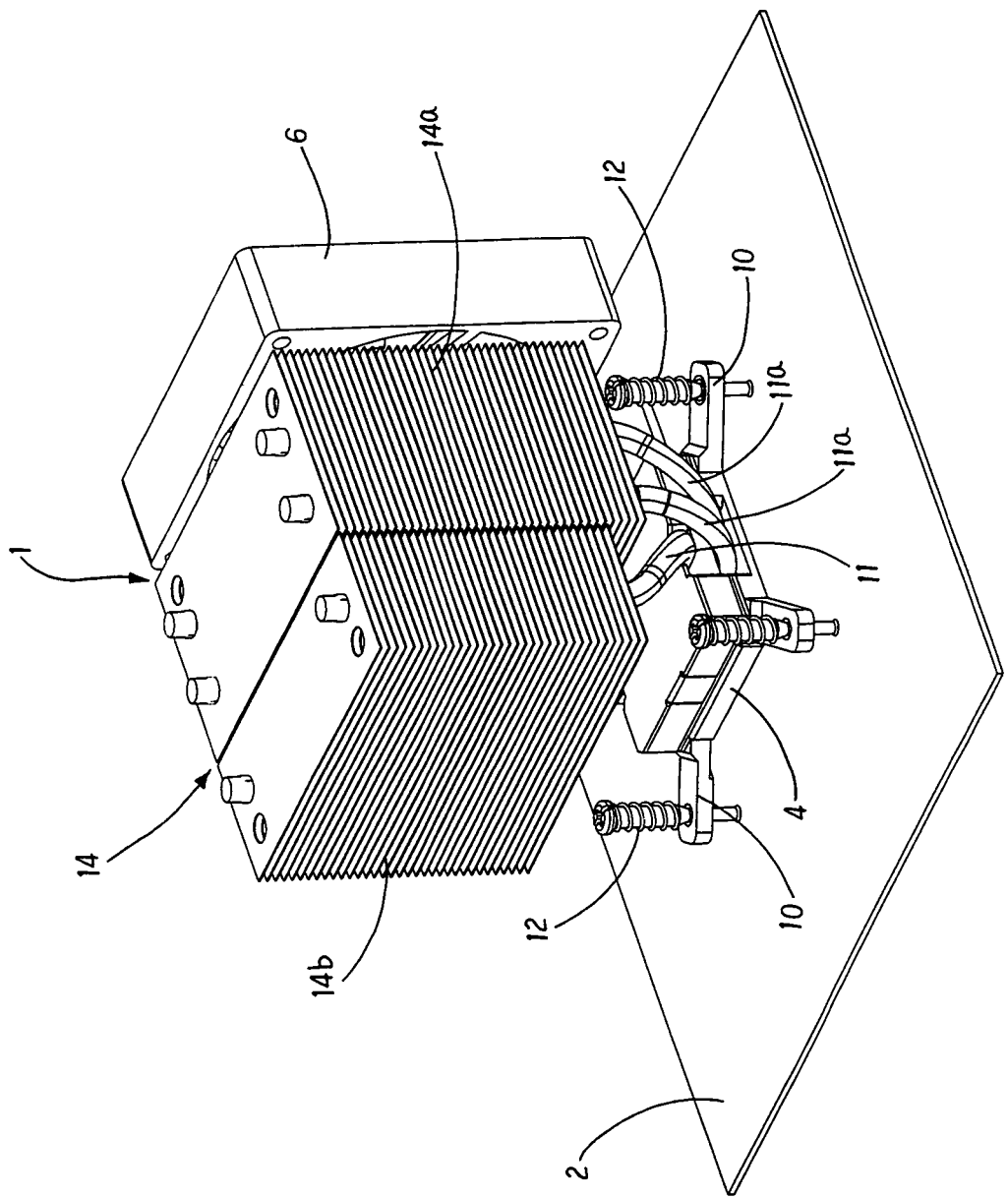
Figure 2:
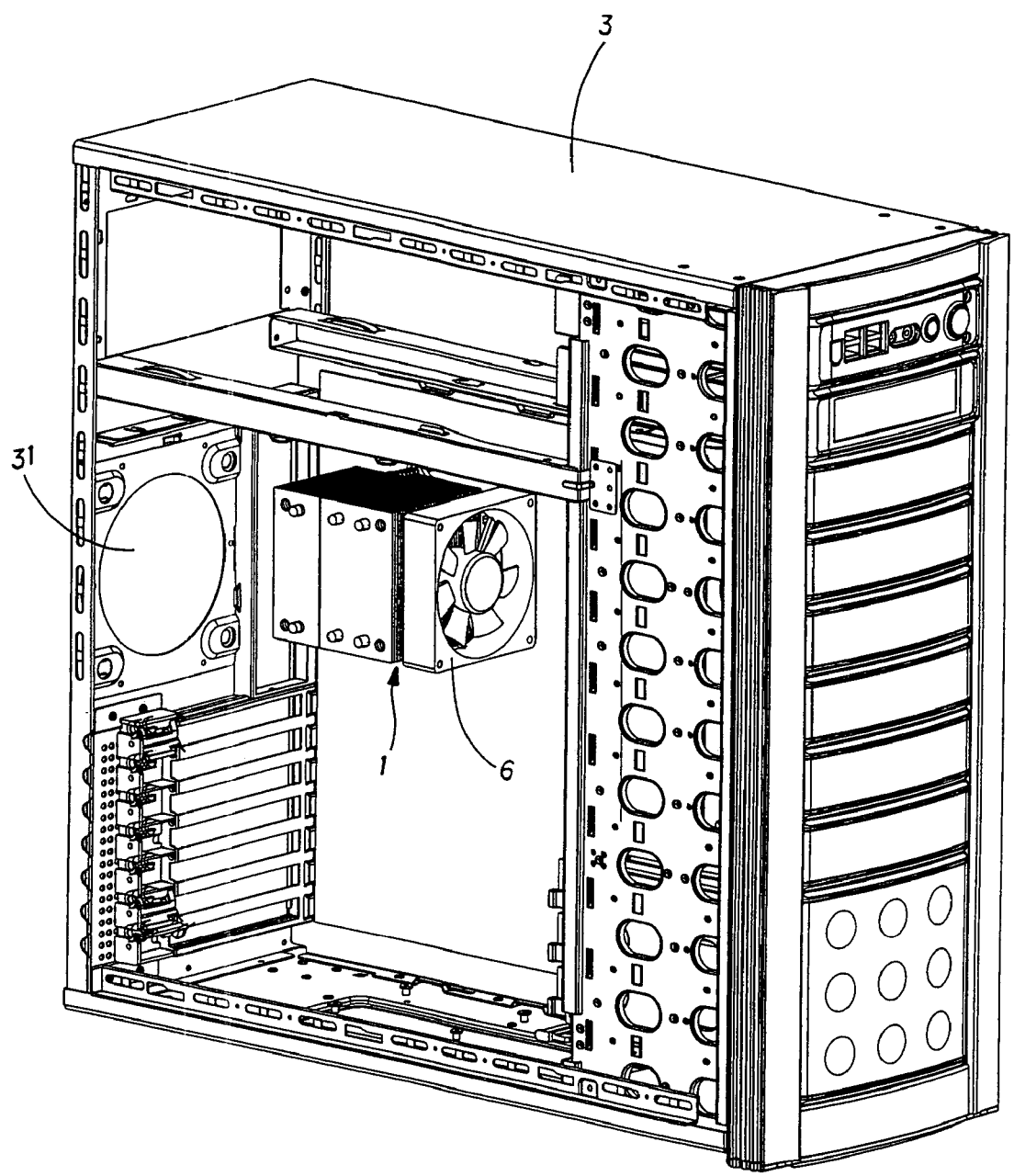
FIG. 2 is a perspective view of a preferred embodiment of the first preferred embodiment installed in a computer chassis.

Referring to FIGS. 1 and 1A, a preferred embodiment of the present invention as a heat radiator comprises a heat radiation module 1 with a heat conducting component going through a radiator fin set 14. The heat conducting component further comprises a first and a second heat conducting pipes 11a and 11, which are stuffed with a working fluid. The heat conducting component can also be made of a metallic material of high conductivity or nanotubes. The heat radiation module 1 in FIG. 1 is extended with a plurality of lower connection members 10 for mounting its base 4 on an electronic component. The heat radiation module 1 is secured on the circuit board 2 by a set of locking members 12. Aside the heat radiation module 1, there is a fan 6 for blowing an air flow onto the radiator fin set 14 of the heat radiation module 1, whereby the flow will take away the heat accumulated on the surfaces of the fins and the heat absorbed by the lower base 4 will continuously propagated through the path of the base 4, the radiator fin set 14 and then to the air flow. FIG. 2 shows a mounting configuration of the present invention with in a computer 3, wherein a fan 6 produced an airflow blown onto the radiator fin set 14, and the heated flow passing the radiator fin set 14 continues to go through a wind exit 31 corresponding to the leeward side opposite to the fan 6. Thereby, the heat generated in the computer 3 will be exhausted by forced convection.

Figure 3:
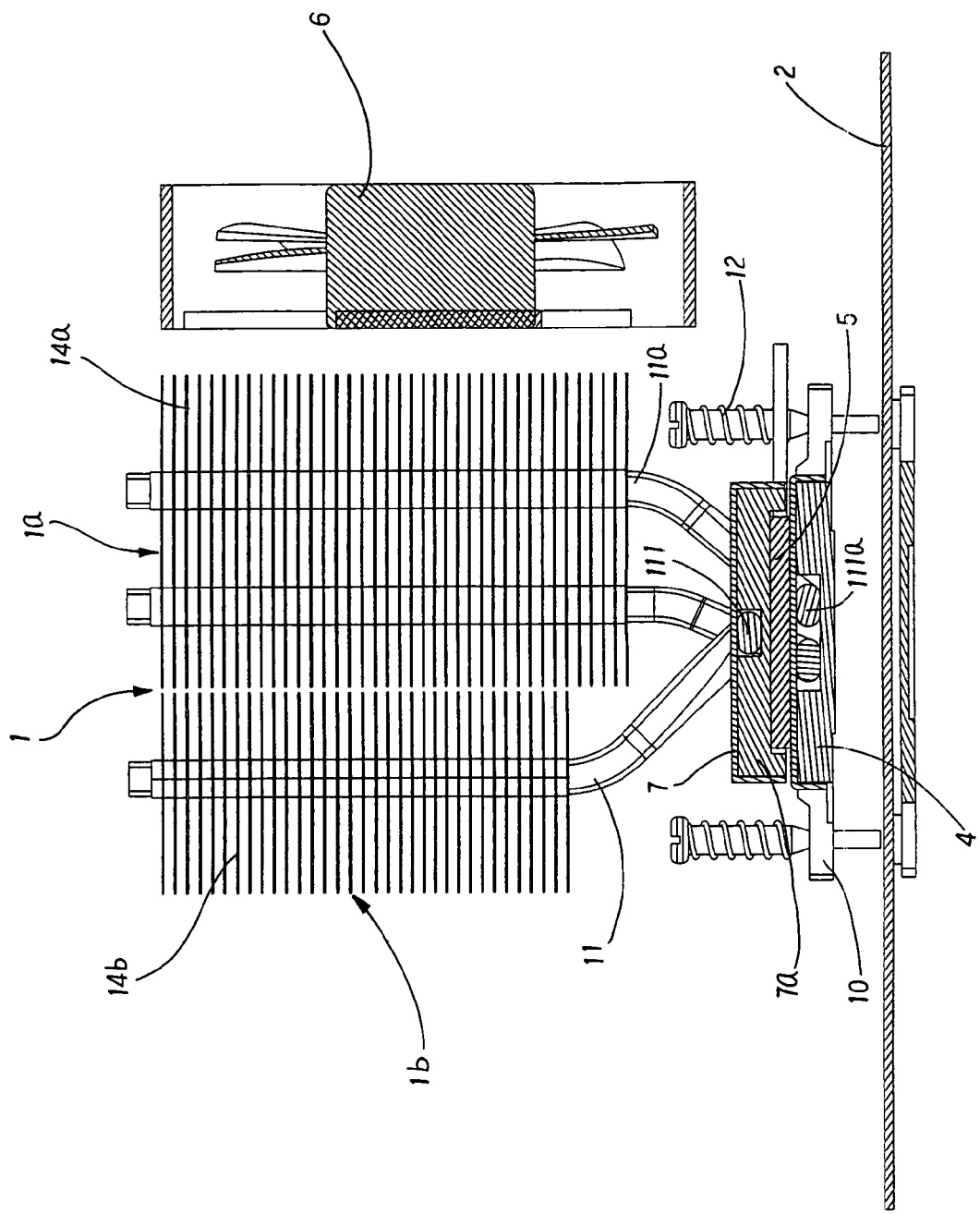
FIG. 3 is a side view of the first set of preferred embodiments in FIG. 1.

Referring to FIG. 3, a thermo-electric cooler 5 is attached onto the base 4 right above a central processing unit (CPU) at a high temperature due to the computation undergoing therein. As before, the base 4 is secured on a circuit board 2 by a set of locking members 12. The thermo-electric cooler 5 is powered by wires 50 so that the heat generated in the central processing unit can be absorbed by a heat-absorbing terminal 51 on the lower side of the thermo-electric cooler 5 to a heat-releasing terminal 52, thereby reducing the temperature of the central processing unit, as shown in FIG. 3A. The thermo-electric cooler 5 further includes a surrounding heat conducting member 7, whereby a heat dissipation space 7a will form between the thermo-electric cooler 5 and the heat conducting member 7. A heat conducting pipe 11b is inserted into the heat dissipation space 7a for conducting away the heat absorbed by the thermo-electric cooler 5 and delivering the heat to a heat radiating fin set 14b by thermal conduction. A heat radiator having multiple heat radiation modules of the present invention comprises a first radiator fin set 14a having a first heat conducting pipe 11a whose lower end 111a is connected to a heat source and a second heat radiating fin set 14b having a second heat conducting pipe 11b whose lower end 111b is attached on the heat-releasing terminal of a thermo-electric cooler 5. The first heat radiation module 1a further includes a first radiator fin set 14a connected to the first heat conducting pipe 11a. The second heat radiation module 1b further includes a second radiator fin set 14b connected to the second heat conducting pipe 11b. A fan 6 is installed on one side of the heat radiation module 1 for driving an airflow onto the first radiator fin set 14a and the second radiator fin set 14b, whereby the heat on the surfaces those fins will be carried away. Another fan coupled with the fan 6 (not shown in the figure) for inducing air convention can also be introduced. The lower end 111a of the first heat conducting pipe 11a is located between the base 4 and a central processing unit. Further, the number of heat pipes associated with the first heat radiation module 1a and the second heat radiation module 1b is not limited to two; it can be increased in accordance with the necessity of heat dissipation. The contact surfaces on the base 4, the thermo-electric cooler 5 and the heat conducting member 7 can be applied with heat-dissipation glue to enhance the efficiency of heat conduction.

Given the faster and faster computer processors, heat generated therein is increasing. If the heat does not dissipate efficiently, the temperature of the CPU will exceed a critical temperature above which its lifespan will be greatly shortened. The multiple thermal conduction paths of the present invention will assist the heat dissipation of a central processing unit and therefore control its operation temperature within an allowed range. The thermal conduction paths are shown in FIG. 3, wherein the first radiation module 1a of the heat radiator 1 has a first heat conducting pipe 11a with one end embedded in the base 4, in proximity of the CPU. Thereby, the heat generated in the CPU will transport across the base 4, through the first heat conducting pipe 11a to the radiator fin set 14a. Since each of the fins of the radiator fin set 14a has a through hole, the first heat conducting pipe 11a will be able to go through, and therefore the heat can be uniformly delivered to each of the fins.

At the same time, the thermo-electric cooler 5 is attached to the upper face of the base 4, whereby the heat at point A can be delivered to point B by Peltier effect. Therefore, the temperature at A can be reduced, whereas the temperature at B increased. The heat propagated to the contact surface (i.e., the heat-absorbing terminal 51) between the thermo-electric cooler 5 and the base 4 will be delivered to the opposite surface (i.e., the heat-releasing terminal 52) of the thermo-electric cooler 5. The lower end 111b of the second heat conducting pipe 11b of the second heat radiation module 1b is embedded in the heat dissipation space 7a between the thermo-electric cooler 5 and the enclosed heat conducting member 7. The second heat conducting pipe 11b extended from the heat dissipation space 7a pierces through the fins of the second heat radiating fin set 14b, whereby the heat from the thermo-electric cooler 5 can be uniformly conducted to each of the fins and blown away by an air current produced by the fan 6 installed aside the heat radiation module 1, achieving the effect of fast heat dissipation.

Figure 4:
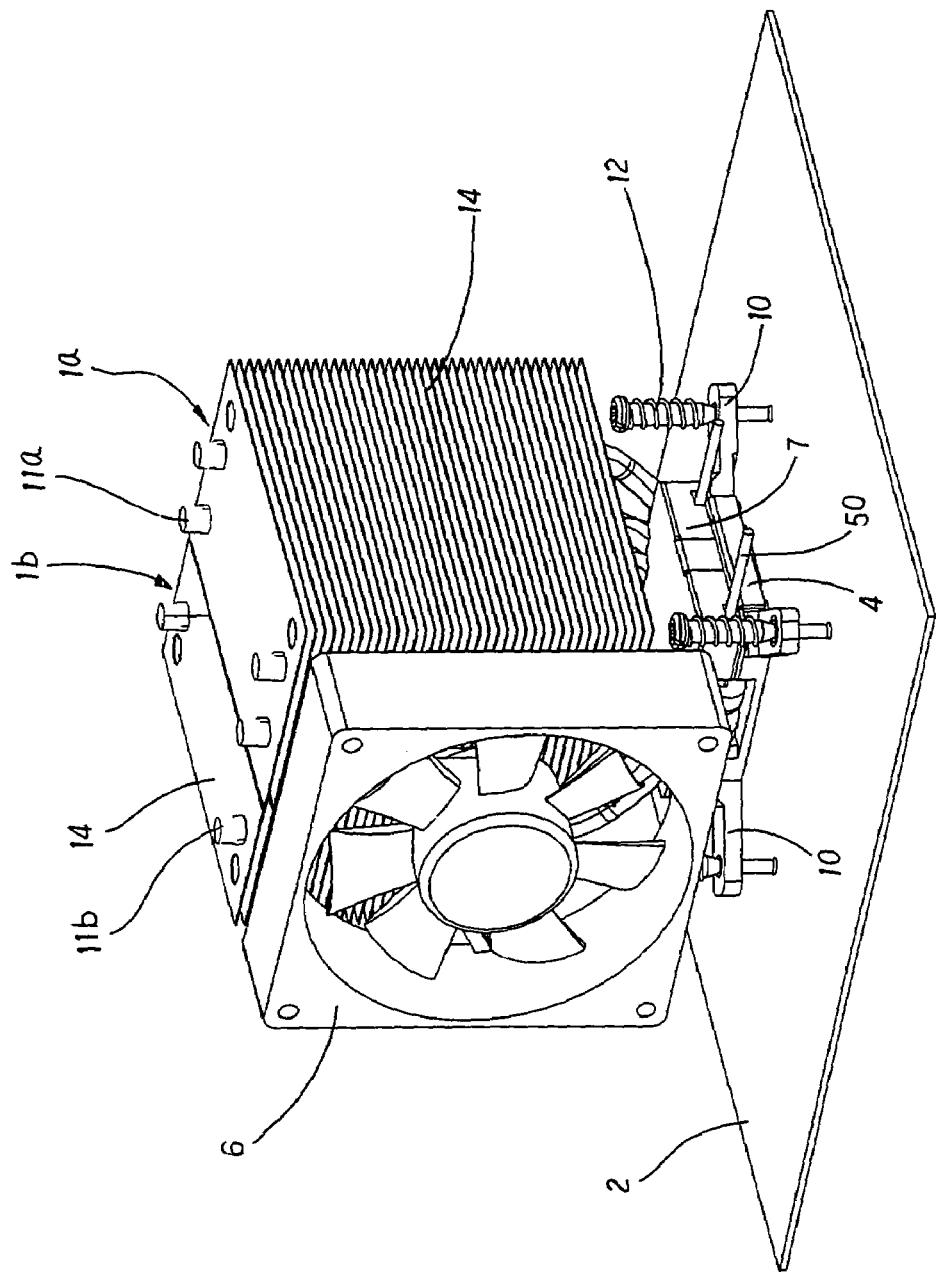
FIG. 4 is a perspective view of the first preferred embodiment with a different fan location.
Figure 5:
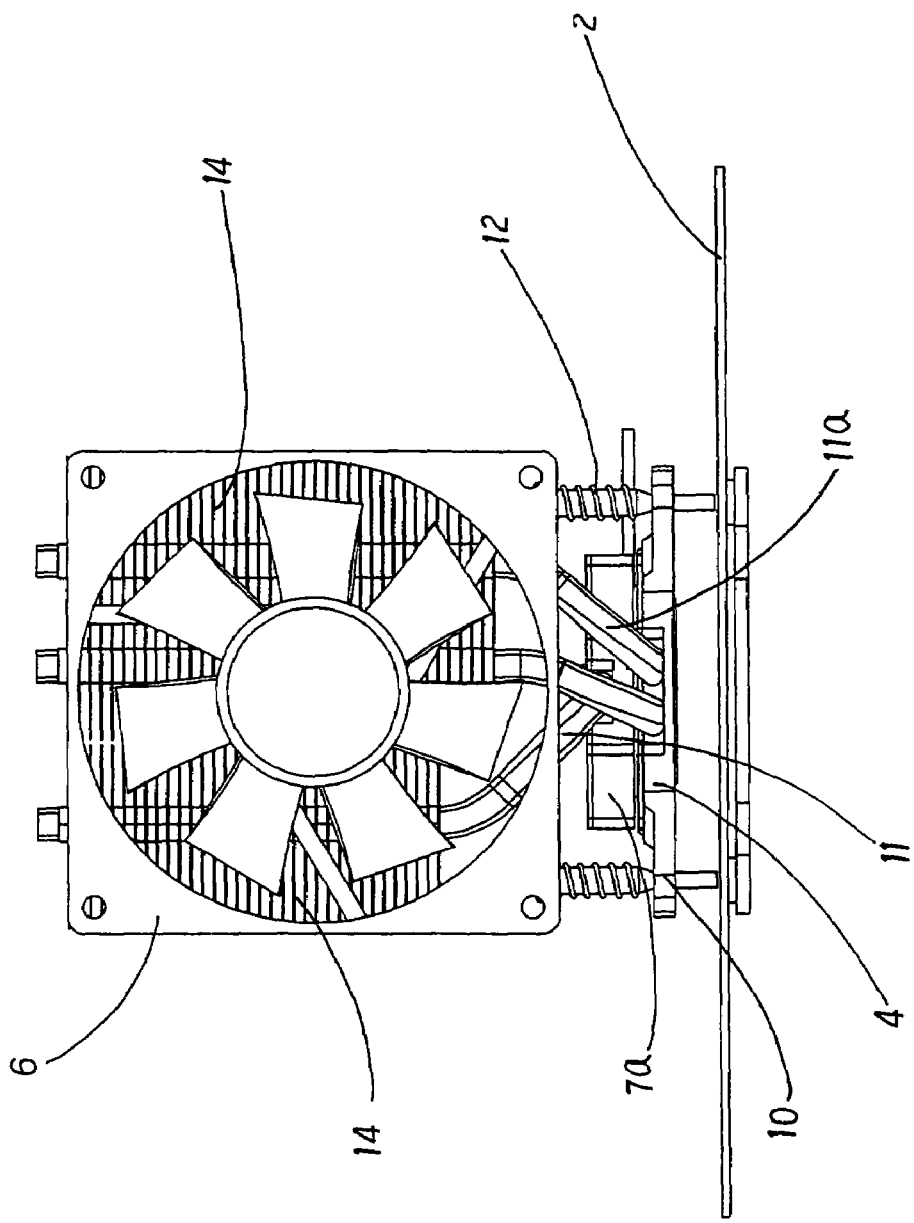
FIG. 5 is a front view of the preferred embodiment in FIG. 4.
Figure 6:
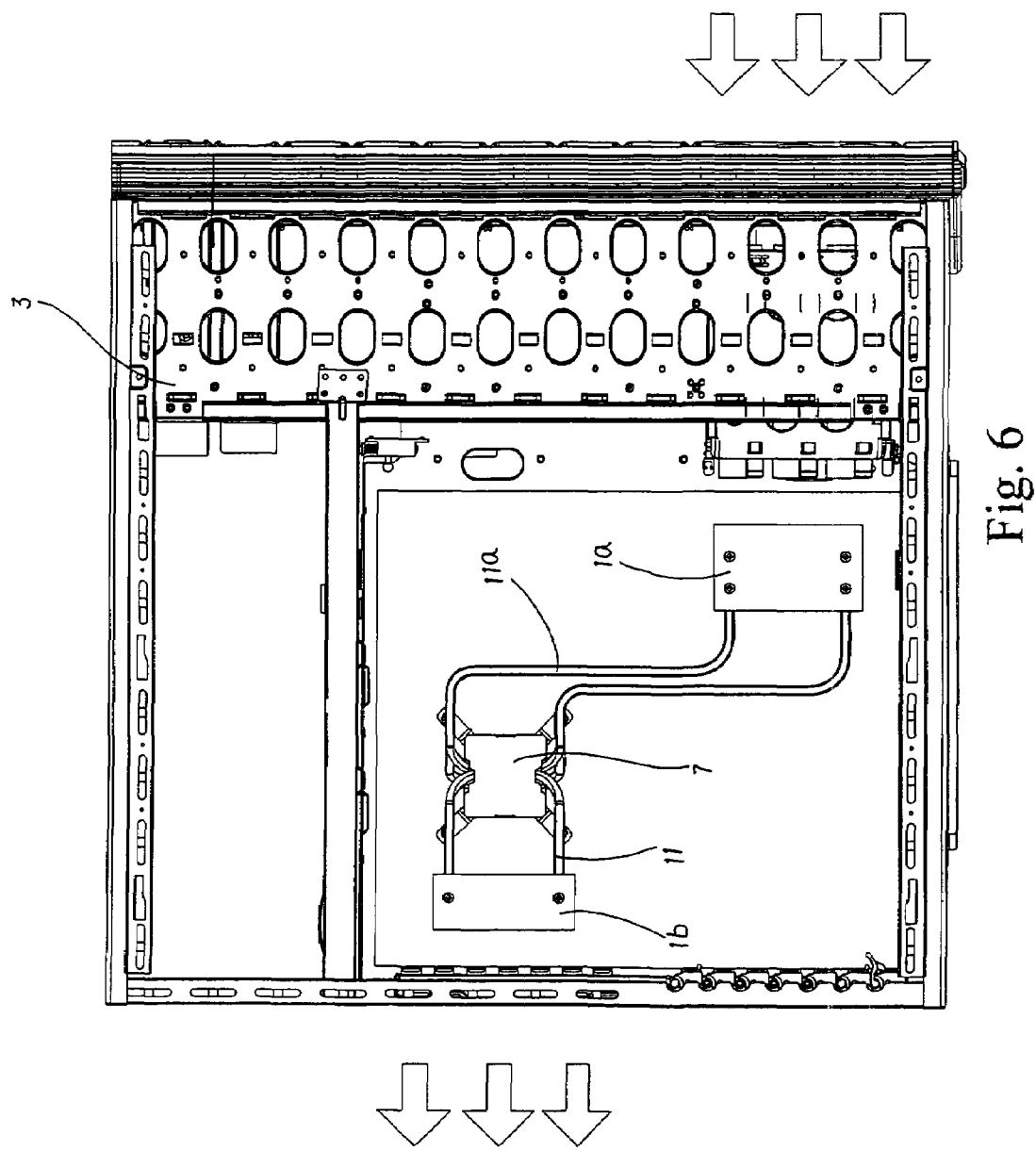
FIG. 6 shows the first preferred embodiment installed in a computer chassis with a different module arrangement.
Figure 7:
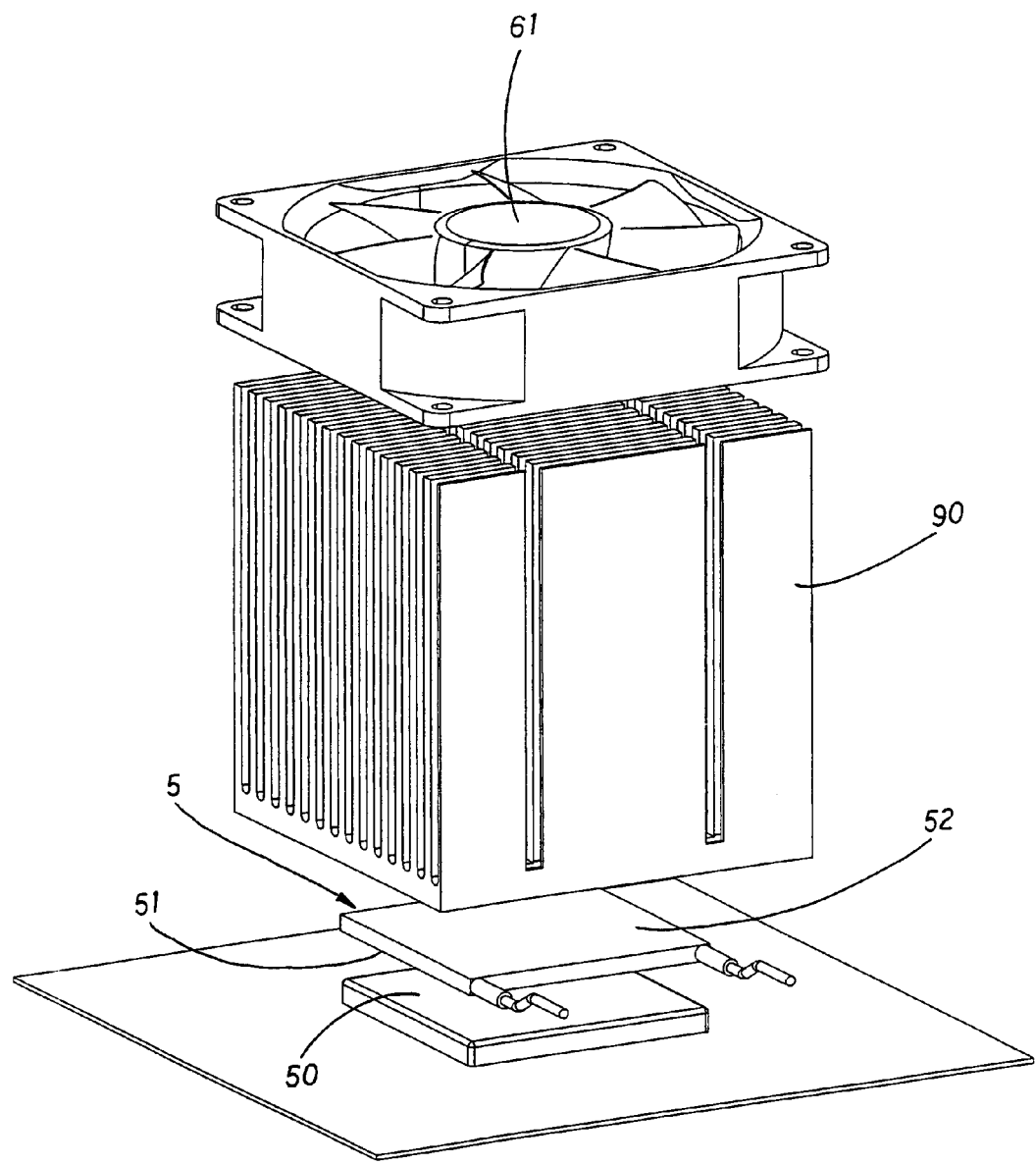
FIGS. 7 and 8 show conventional heat radiators for computer chips.
Figure 8:
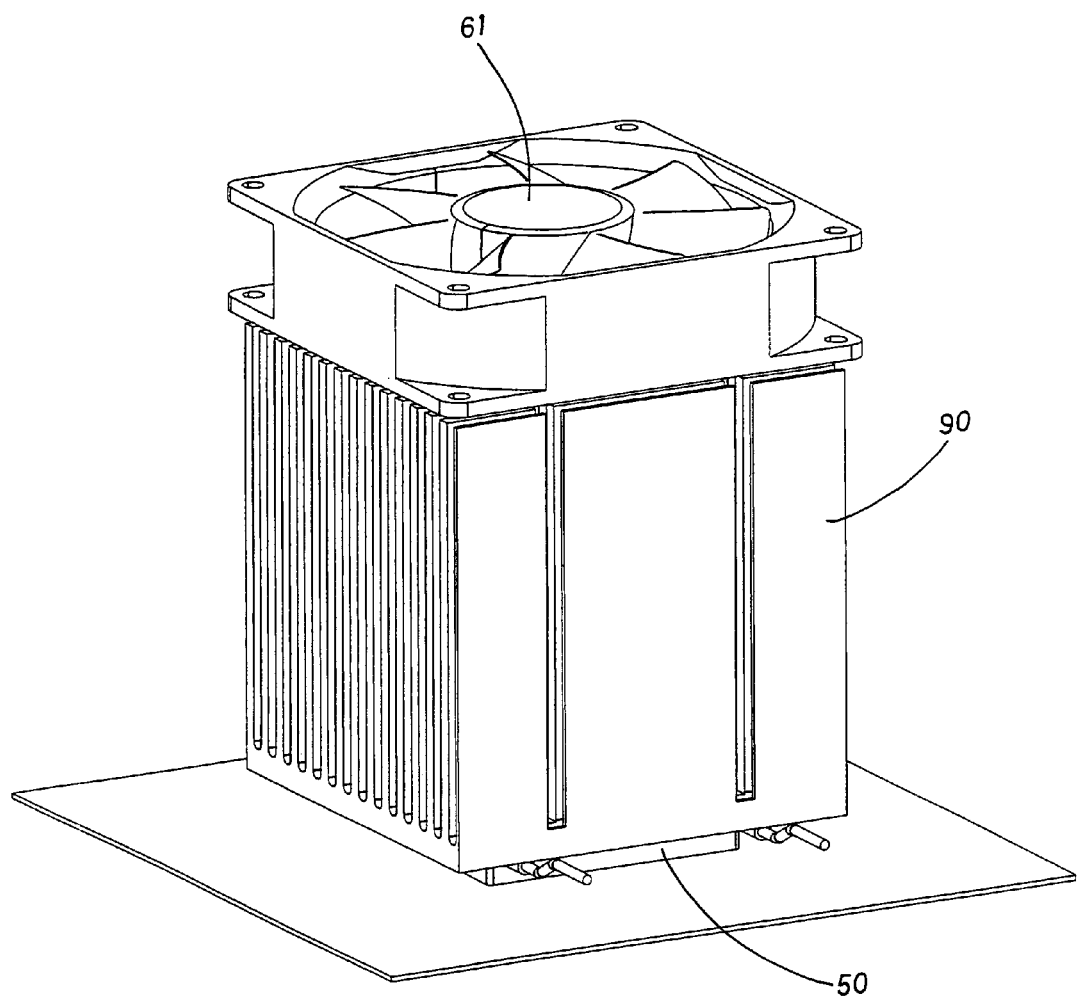

As shown in FIG. 3, the fan 6 is installed on a lateral side of the radiator fin set 14a of the first heat radiation module 1a. Since the heat generating rate of the CPU is higher than that of the thermo-electric cooler 5, the cold airflow will firstly blow the first radiator fin set 14a connected to the first heat conducting pipe 11a. However, the location of the fan 6 in FIGS. 4 and 5 is on the lateral side jointing the first radiator fin set 14a of the first heat radiation module 1a and the second radiator fin set 14b of the second heat radiation module 1b, whereby the airflow produced by the fan 6 will cool the first radiator fin set 14a and the second radiator fin set 14b at the simultaneously. Therefore, the cold airflow will exchange heat with the surfaces of the fins in 14a and 14b at the same time, whereby the heat conducted through the first heat conducting pipe 11a and the second heat conducting pipe 11b will be guided away, achieving the heat dissipation of the CPU and the thermo-electric cooler 5.

If allowed by the inner space of a computer chassis, the first heat radiation module 1a and the second heat radiation module 1b can be independently located, with their respective heat pipes 11a, 11 extended from the same heat source and with respective fans, so as to dissipate heat from the heat source. For instance, the lower end 111a of the first heat conducting pipe 11a of the first heat radiation module 1a may be extended away from the CPU to the first radiator fin set 14a, on which heat is uniformly spread and carried away by the airflow blown by a fan hidden underneath the circuit board. Meanwhile, the lower end 111b of the second heat conducting pipe 11b of the second heat radiation module 1b may be extended away from the thermo-electric cooler 5 on the CPU to the second radiator fin set 14b and carried away by the airflow sucked away by a fan installed on the rear wall of the computer chassis.

The present invention is thus described, and it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A heat radiator having a thermo-electric cooler, comprising:
 a first heat radiation module having a radiator fin set and a heat conducting component connected to each fin of said radiator fin set, said heat conducting component having one end extended close to a heat source;
 a thermoelectric cooler having a heat-absorbing terminal and a heat-releasing terminal, whereby heat generated in said heat source will be transported from said heat-absorbing terminal to said heat-releasing terminal; and
 a second heat radiation module having a radiator fin set and a heat conducting component connected to each fin of said radiator fin set, said heat conducting component having one end extended to said heat-releasing terminal of said thermo-electric cooler;
  whereby said heat source will dissipate heat through both paths of said first heat radiation module and said second heat radiation module plus said thermo-electric cooler.

2. The heat radiator having a thermo-electric cooler of claim 1 wherein a first end of said heat conducting component of said first heat radiation module is embedded in a base that is in turn connected with said heat source.

3. The heat radiator having a thermo-electric cooler of claim 1 wherein a second end of said heat conducting component of said first heat radiation module is extended to a place of good ventilation.

4. The heat radiator having a thermo-electric cooler of claim 1 wherein a first end of said heat conducting component of said second heat radiation module is extended to said heat-releasing terminal of said thermo-electric cooler.

5. The heat radiator having a thermo-electric cooler of claim 1 wherein a second end of said heat conducting component of said second heat radiation module is extended to a place of good ventilation.

6. The heat radiator having a thermo-electric cooler of claim 1 wherein said thermo-electric cooler is enclosed within a heat conducting layer for absorbing heat from said heat-releasing terminal of said thermo-electric cooler; said heat radiation module delivering heat from said thermo-electric cooler through said heat conducting component of said second heat radiation module to said radiator fin set thereon.

7. The heat radiator having a thermo-electric cooler of claim 1 wherein a fan is installed on a lateral side of any of said radiator fin sets.

8. The heat radiator having a thermo-electric cooler of claim 1 wherein said first heat radiation module is provided with at least an extra heat conducting component with one end attached to said heat source and another end going through said heat radiator fin set therein for enhancing heat dissipation.

9. The heat radiator having a thermo-electric cooler of claim 1 wherein said second heat radiation module is provided with at least an extra heat conducting component with one end attached to one face of said thermo-electric cooler and another end going through said heat radiator fin set therein for enhancing heat dissipation.

10. The heat radiator having a thermo-electric cooler of claim 1 wherein said heat conducting components are selected from heat conducting pipes, metallic bodies of high thermal conductivity and carbon nanotubes.

* * * * *